ated circuit structure is provided with an inductor
United States Patent

Qian et al.

[11] Patent Number: 6,166,422
[45] Date of Patent: Dec. 26, 2000

[54] INDUCTOR WITH COBALT/NICKEL CORE FOR INTEGRATED CIRCUIT STRUCTURE WITH HIGH INDUCTANCE AND HIGH Q-FACTOR

[75] Inventors: Linggian Qian, San Jose; Wen-Chin Stanley Yeh, Fremont, both of Calif.

[73] Assignee: LSI Logic Corporation, Milpitas, Calif.

[21] Appl. No.: 09/079,413

[22] Filed: May 13, 1998

[51] Int. Cl.$^7$ ...................................................... H01L 29/00
[52] U.S. Cl. .......................................................... 257/531
[58] Field of Search ............................................. 257/531

[56] References Cited

U.S. PATENT DOCUMENTS

| | | | |
|---|---|---|---|
| 3,609,083 | 9/1971 | Slick ..................................... | 252/62.62 |
| 4,649,755 | 3/1987 | Volz ..................................... | 73/861.78 |
| 5,070,317 | 12/1991 | Bhagat ..................................... | 257/531 |
| 5,372,967 | 12/1994 | Sundaram et al. ......................... | 437/60 |
| 5,387,551 | 2/1995 | Mizoguchi et al. ...................... | 437/209 |
| 5,396,101 | 3/1995 | Shiga ..................................... | 257/531 |
| 5,396,527 | 3/1995 | Schlecht et al. ........................... | 377/57 |
| 5,529,831 | 6/1996 | Waga et al. .............................. | 428/209 |
| 5,576,680 | 11/1996 | Ling ........................................ | 336/200 |
| 5,626,789 | 5/1997 | Varshney ............................... | 252/62.62 |
| 5,635,892 | 6/1997 | Ashby et al. ........................... | 336/200 |
| 5,748,523 | 5/1998 | Thomas et al. ......................... | 365/171 |
| 5,834,825 | 11/1998 | Imai ........................................ | 257/531 |

FOREIGN PATENT DOCUMENTS 7-37711 2/1995 Japan .

OTHER PUBLICATIONS

Allen, Mark G., "Integrated Inductors for Low Cost Electronic Packages", *IEDM*, 1995, pp. 137–141.
Yue, C. Patrick, et al., "A Physical Model for Planar Spiral Inductors on Silicon", *IEDM*, 1996, pp. 155–158.

*Primary Examiner*—David Hardy
*Assistant Examiner*—Jesse A. Fenty
*Attorney, Agent, or Firm*—John P. Taylor

[57] ABSTRACT

An integrated circuit structure is provided with an inductor formed therein which comprises a metal coil on an insulated surface over a semiconductor substrate, and a high magnetic susceptibility cobalt/nickel metal core located adjacent said metal coil, but spaced therefrom by one or more insulation layers. In one embodiment, the high magnetic susceptibility cobalt/nickel metal core is placed between lower and upper portions of the metal coil which are interconnected together by filled vias. In another embodiment, the metal coil is formed in a serpentine shape in one plane on an insulated surface over the semiconductor substrate, and the high magnetic susceptibility cobalt/nickel metal core is formed over the serpentine coil, but spaced from the serpentine coil by another insulation layer.

8 Claims, 9 Drawing Sheets

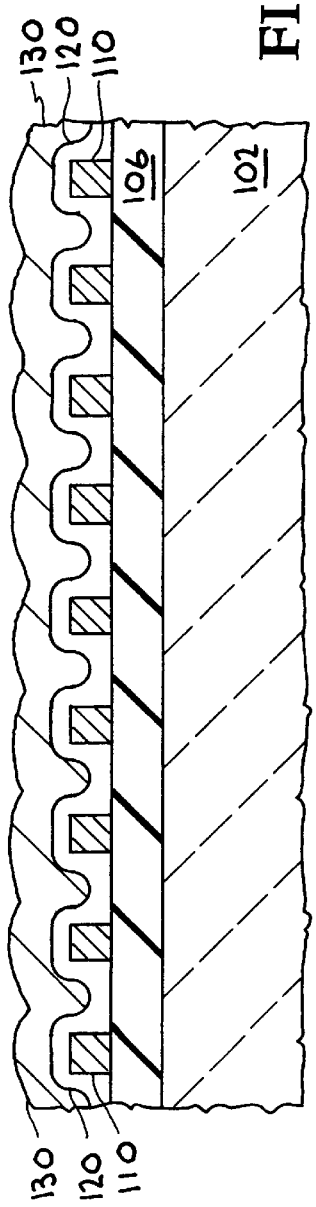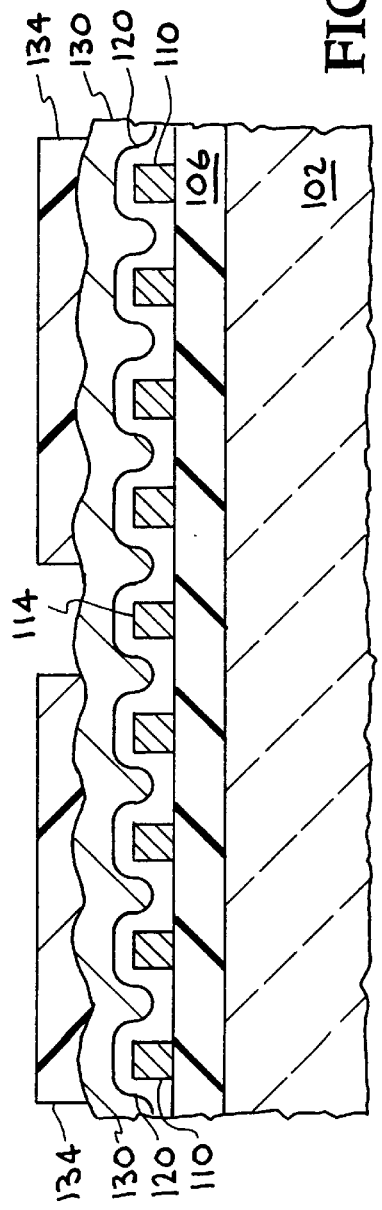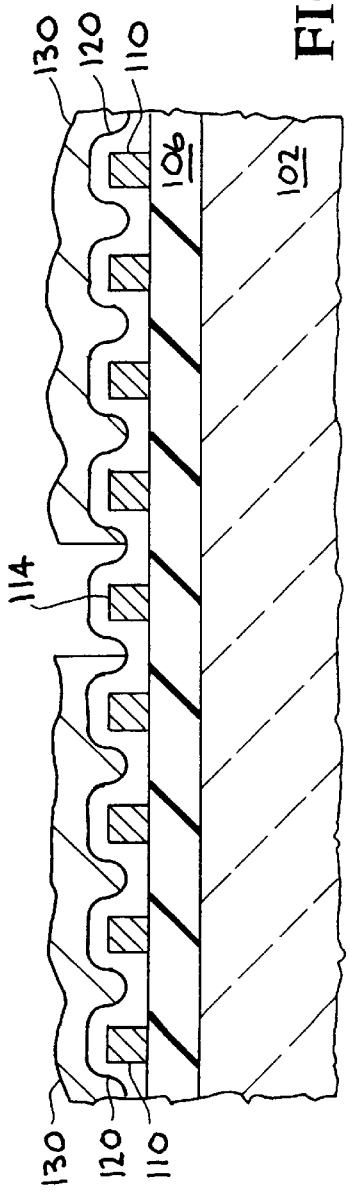

INDUCTOR WITH COBALT/NICKEL CORE FOR INTEGRATED CIRCUIT STRUCTURE WITH HIGH INDUCTANCE AND HIGH Q-FACTOR

BACKGROUND OF THE INVENTION

1. Field of the Invention

This invention relates to an inductor for an integrated circuit structure characterized by a high magnetic susceptibility cobalt/nickel core material, and a method of making the inductor.

2. Description of the Related Art

In the formation of integrated circuit structures, active devices such as MOS and bipolar transistors are formed either in the semiconductor substrate or on layers, such as epitaxial layers, formed over the substrate. Passive electronic devices such as resistors and capacitors are also formed either within the semiconductor substrate or on/in conductive materials formed over the surface of the semiconductor substrate.

While inductors also comprise devices utilized in the formation of electronic circuits, their formation in integrated circuit structures has been more difficult, due to the large area needed to form an inductor with a useful amount of inductance and a high enough Q-factor, due to the low inductance of the materials conventionally used to form the inductor.

However, the formation of inductors on silicon substrates has been explored. Yue et al., in an article entitled *A Physical Model for Planar Spiral Inductors on Silicon*, published in IEDM-96, at pages 155–158, discusses the formation of an inductor on a silicon substrate, but does not discuss the use of a magnetic core material with the inductor; while Mark G. Allen, in an article entitled *Integrated Inductors for Low Cost Electronic*, published in IEDM-95, at pages 137–141, describes various shapes and configurations for inductors formed on a multichip module (MCM) substrate using iron-nickel and air coils. Ling U.S. Pat. No. 5,576,680 discloses a process for forming an inductor on a semiconductor substrate wherein first parallel strips of conductive material are deposited over a dielectric layer, which may be a layer of non-conductive high magnetic susceptible material (HMSM). A second layer of a dielectric (which may also be a non-conductive high magnetic susceptible material) is then formed over the parallel strips. If this second layer of dielectric material is not a high magnetic susceptible material, a layer of high magnetic susceptible material is formed over the second dielectric material (to form the core of HMSM of the inductor) and a further dielectric layer is formed over the high magnetic susceptible material. In either instance, filled vias are formed through the dielectric layer(s) down to the ends of the first parallel strips of conductive material. A further layer of metal lines is then formed over the structure and in contact with the filled vias to connect the opposite ends of the first strips of conductive material to thereby form a spiral coil surrounding the HMSM core. The type of material which may constitute this layer of HMSM is never identified, however, by Ling.

Ashby et al. U.S. Pat. No. 5,635,892 discloses the formation of inductors on or within a substrate material such as a semiconductor material or a dielectric material using a high magnetic permeability material such as iron spaced from a spiral conductor by a dielectric layer. Special configurations of the high magnetic permeability core material are discussed for lowering the magnetic coupling and to reduce eddy current losses.

Sundaram et al. U.S. Pat. No. 5,372,967 describe the formation of an inductor or a transformer in a series of parallel spaced apart trenches formed in an insulator or a semiconductor substrate. The trenches are lined at the bottom and opposite ends with a conductor. The walls between the trenches may then be removed and the resulting large single trench may be filled with a dielectric core material. Alternatively, a high permeability magnetic material such as ferrite may be used as the core material, in which case the core material is insulated from the conductor by a dielectric liner. Metal interconnects are then used to couple together opposite ends of the respective conductors in the trenches to form a long spiral conductor above and below the core material.

Volz U.S. Pat. No. 4,649,755 discloses the formation of an inductor wherein narrow conductive strips comprising a first portion of a coil are formed over a substrate, a first dielectric layer is formed over the first portion of the coil, and a magnetic core in the form of a ring is formed over the first dielectric layer. A second dielectric layer is then formed over the magnetic core and a second set of conductive strips, connected to the first conductive strips, is formed over the second dielectric layer. Materials said to be suited for the magnetic core are ferromagnetic amorphous metals. Good ferromagnetic properties are said to be exhibited by amorphous metals which are alloys based on transition metals of the iron group. Especially suited are said to be amorphous metals which are Co-Fe-base alloys, preferably $Co_xFe_yB_{100-x-y}$ where $70\pm x\pm 80$ and $4\pm y\pm 10$.

Thus, the formation of inductors on semiconductor substrates is not unknown. However, the use of iron as the magnetic material for the core of the inductor, or at least an iron-containing magnetic core such as ferrite or an iron-containing metal alloy, seems to be considered essential to the formation of an inductor on a semiconductor substrate with sufficient inductance and high Q factor. While the use of iron or iron-containing material as the high magnetic susceptible material for the core of an inductor is well-recognized in the electronics industry, the formation of integrated circuits structures requires the judicial selection of materials which will be compatible with other materials already in use in the fabrication of integrated circuit structures on semiconductor substrates. Unfortunately, iron is not one of the materials in widespread use in the formation of integrated circuit structures, at least in part due to the ease with which iron is oxidized in the presence of either air or moisture.

Quite surprisingly, we have discovered an inductor for an integrated circuit structure characterized by high inductance and a high Q-factor which can be constructed as a part of the integrated circuit structure without the need to utilize an unreasonable amount of the area of the semiconductor substrate, and which can be constructed with a high magnetic susceptibility metal core without the introduction of a foreign material into the integrated circuit structure.

SUMMARY OF THE INVENTION

In accordance with the invention, an integrated circuit structure is provided with an inductor formed therein which comprises a metal coil on an insulated surface over a semiconductor substrate, and a high magnetic susceptibility cobalt/nickel metal core located adjacent said metal coil, but spaced therefrom by one or more insulation layers. In one embodiment, the high magnetic susceptibility cobalt/nickel metal core is placed between lower and upper portions of the metal coil which are interconnected together by filled vias.

In another embodiment, the metal coil is formed in a serpentine shape in one plane on an insulated surface over the semiconductor substrate, and the high magnetic susceptibility cobalt/nickel metal core is formed over the serpentine coil, but spaced from the serpentine coil by another insulation layer.

BRIEF DESCRIPTION OF THE DRAWINGS

FIG. 13 is a fragmentary vertical cross-sectional view of the structure of FIG. 12 showing the formation of a confirm second layer of insulation over the serpentine metal coil, and a layer of high magnetic susceptibility cobalt/nickel metal formed over the second insulation layer.

FIG. 14 is a fragmentary vertical cross-sectional view of the structure of FIG. 13 showing the formation of a resist mask over the cobalt/nickel layer.

FIG. 15 is a fragmentary vertical cross-sectional view of the structure of FIG. 14 after etching of the cobalt/nickel layer to remove a portion thereof over the center contact of the serpentine coil shown in FIG. 12, and after removal of the resist mask.

DETAILED DESCRIPTION OF THE INVENTION

In accordance with the invention, an integrated circuit structure is provided with an inductor formed therein which comprises a metal coil on an insulated surface over a semiconductor substrate, and a high magnetic susceptibility cobalt/nickel metal core located adjacent said metal coil, but spaced therefrom by one or more insulation layers. In one embodiment, the high magnetic susceptibility cobalt/nickel metal core is placed between lower and upper portions of the metal coil which are interconnected together by filled vias. In another embodiment, the metal coil is formed in a serpentine shape in one plane on an insulated surface over the semiconductor substrate, and the high magnetic susceptibility cobalt/nickel metal core is formed over the serpentine coil, but spaced from the serpentine coil by another insulation layer.

By use of the term "cobalt/nickel metal" in the expression "high magnetic susceptibility cobalt/nickel metal core" is meant a metal selected from the group consisting of cobalt metal, nickel metal, and an alloy of the two metals. Cobalt and nickel, unlike other known inductor core material (e.g., such as iron-based core materials), provide the desired high magnetic susceptibility metal for the core of the inductor without introducing a foreign material into the integrated circuit structure. Cobalt and nickel have both been previously used in the formation of metal silicide contacts in integrated circuit structures. Of the two metals, the use of cobalt for the core material is preferred. It should be noted, in this regard, that the deposition of the cobalt or nickel metals (or an alloy of the two metals) may be designed to correspond to the deposition of the same metal elsewhere on the integrated circuit structure, e.g., for the purpose of making metal silicide contacts, in which case no extra processing steps for the deposition may be necessary.

When the high magnetic susceptibility metal core is made of cobalt, the cobalt metal should have a purity of at least 99 wt. % cobalt, preferably at least 99.5 wt. % cobalt, and most preferably at least 99.9 wt. % cobalt. When the high magnetic susceptibility metal core is made of nickel, the nickel metal should have a purity of at least 99 wt. % nickel, preferably at least 99.5 wt. % nickel, and most preferably at least 99.9 wt. % nickel. When the high magnetic susceptibility core metal comprises an alloy of cobalt and nickel, the maximum total impurities should not exceed 1 wt. %, preferably not more than 0.5 wt. %, and preferably not more than 0.1 wt. %.

Figure 1:
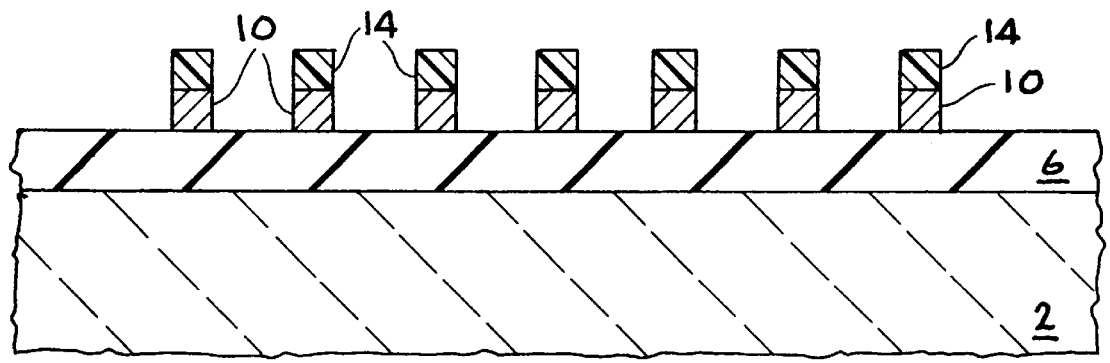
FIG. 1 is a fragmentary vertical cross-sectional view of an early stage of construction of the inductor of the invention showing the formation of the lower portion of the metal coil over a first insulation layer on a semiconductor substrate.
Figure 2:
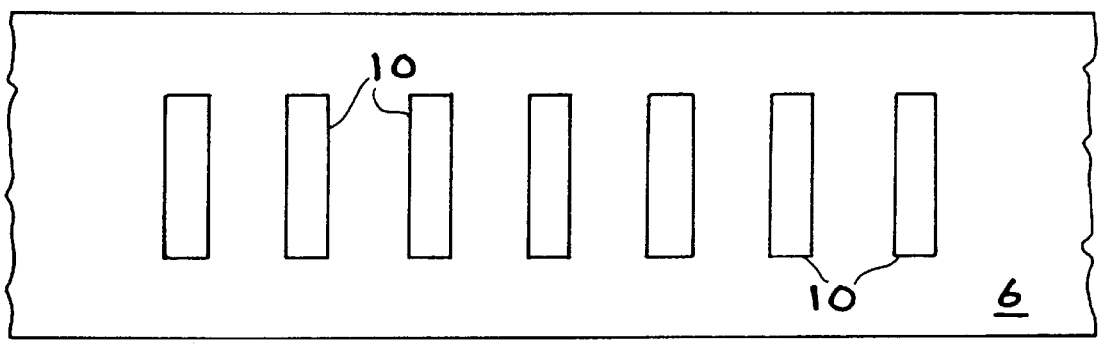
FIG. 2 is a top view of the structure shown in FIG. 1 with the photoresist mask removed.

Turning now to the drawings, the construction of an inductor for an integrated circuit structure having the high magnetic susceptibility metal core material of the invention will be illustrated. FIGS. 1 and 2 illustrate the formation of the lower portions of the metal coils for the inductor. A semiconductor substrate shown at 2 in FIG. 1 may, for example, comprise a single crystal silicon substrate which may have other portions of the integrated circuit structure already constructed in or on substrate 2. Formed over substrate 2 is an insulation layer 6 which may comprise any insulation material such as, for example, silicon oxide or silicon nitride, compatible with the formation of integrated circuit structures. A series of parallel, spaced apart, metal strips 10 are formed on the upper surface of insulation layer to form the lower portions of the metal coils of the inductor. Metal strips 10 may be formed, as shown in FIG. 1, by a blanket deposition of a metal layer, followed by formation of a resist mask 14 over the metal layer, and then followed by etching away the unmasked portions of the metal layer. Any metal used in integrated circuit structures may be used to form metal strips 10 such as, for example, aluminum, titanium, tungsten, or copper.

Figure 3:
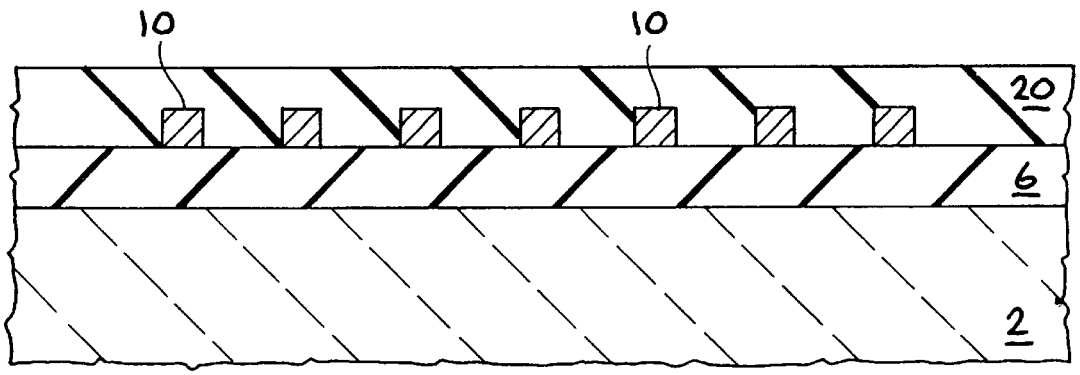
FIG. 3 is a fragmentary vertical cross-sectional view of the structure of FIG. 2 after formation of a planarized second insulation layer over the lower portion of the metal coil.

A second insulation layer 20 may then be formed over metal strips 10 and first insulation layer 6, as shown in FIG. 3, which is then planarized by any planarizing method such as by etching or by chemical/mechanical polishing (CMP). The thickness of second insulation layer 20 over the top surfaces of metal strips 10 will vary from about 100 Angstroms (Å) to about 1000 Å, and preferably will range from about 200 Å to about 500 Å. Second insulation layer 20, like first insulation layer 6, may be formed of any insulation material such as, for example, silicon oxide or silicon nitride, compatible with the formation of integrated circuit structures.

Figure 1A:
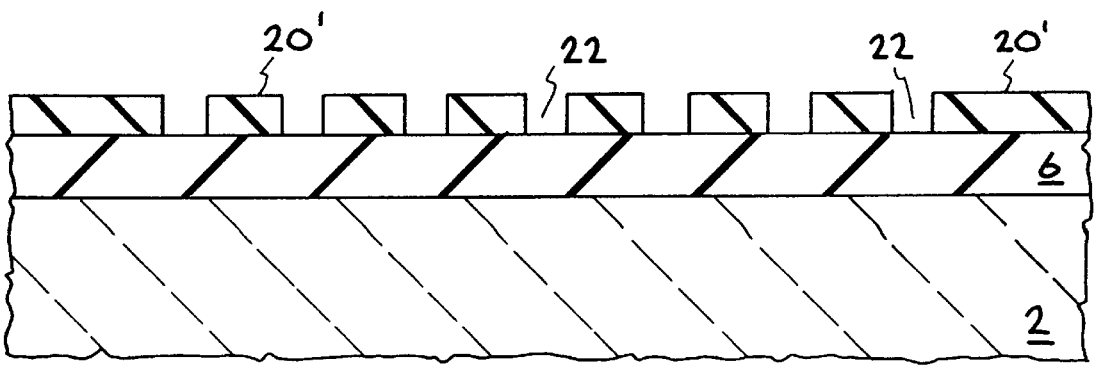
FIG. 1A is another fragmentary vertical cross-sectional view of an early stage of construction of the inductor of the invention showing the formation of the lower portion of the metal coil by a different method from that shown in FIG. 1.

Alternatively, as illustrated in FIG. 1A, metal strips 10 may be formed by first depositing a second insulation layer 20' over the entire surface of first insulation layer 6, and then forming a series of parallel spaced apart grooves or trenches 22 through second insulation layer 20'. Although it is not necessary, formation of uniform depth trenches may be facilitated by selection of a different insulation material for layer 20' than first insulation layer 6, and selection of an etch system selective to the insulation material utilized for underlying first insulation layer 6 so that layer 6 may be used as an etch stop layer. A blanket layer of metal (such as any of the previously described metals) is then deposited over the entire surface to fill trenches 22. The structure is then subject to a CMP to remove all metal on the surface of layer 20', leaving a series of spaced apart parallel metal strips in the parallel trenches. Subsequent deposition of a further layer of insulation material (which may be the same material as used for second insulation layer 20') will result in the formation of the substantially the same structure as shown in FIG. 3.

Figure 4:
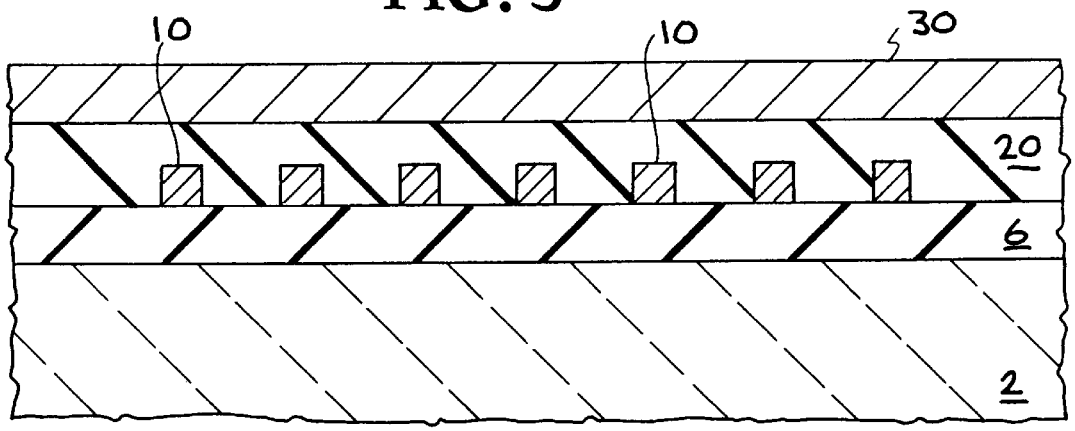
FIG. 4 is a fragmentary vertical cross-sectional view of the structure of FIG. 3 after formation of the high magnetic susceptibility cobalt/nickel metal core over the planarized second insulation layer.
Figure 5:
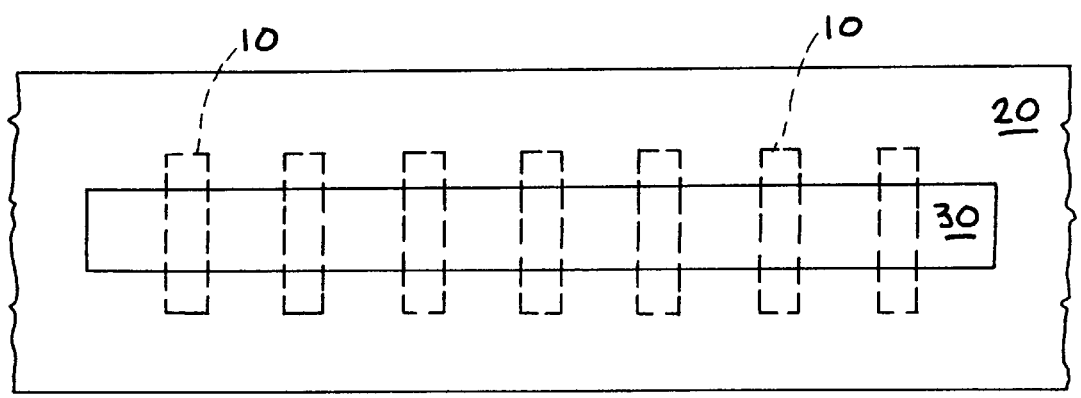
FIG. 5 is a top view of the structure of FIG. 4.
Figure 3A:
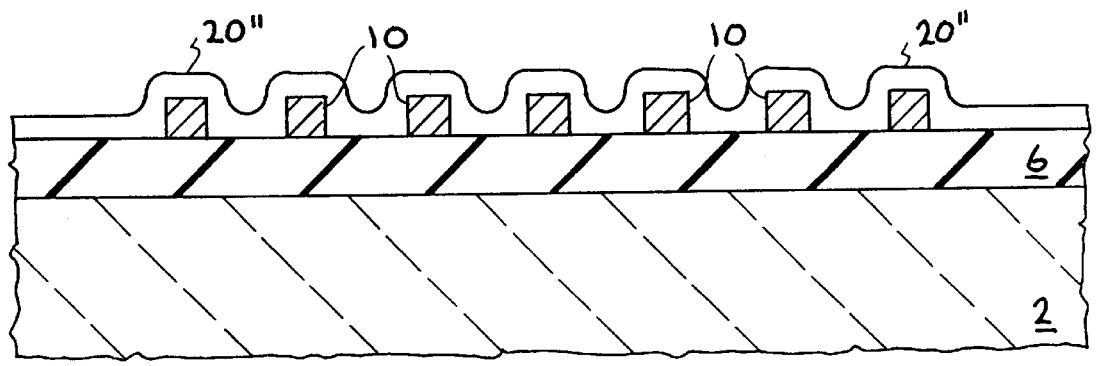
FIG. 3A is a fragmentary vertical cross-sectional view of the formation of a conformal second insulation layer over the metal coil of FIG. 2 instead of the planarized second insulation layer illustrated in FIG. 3.
Figure 4A:
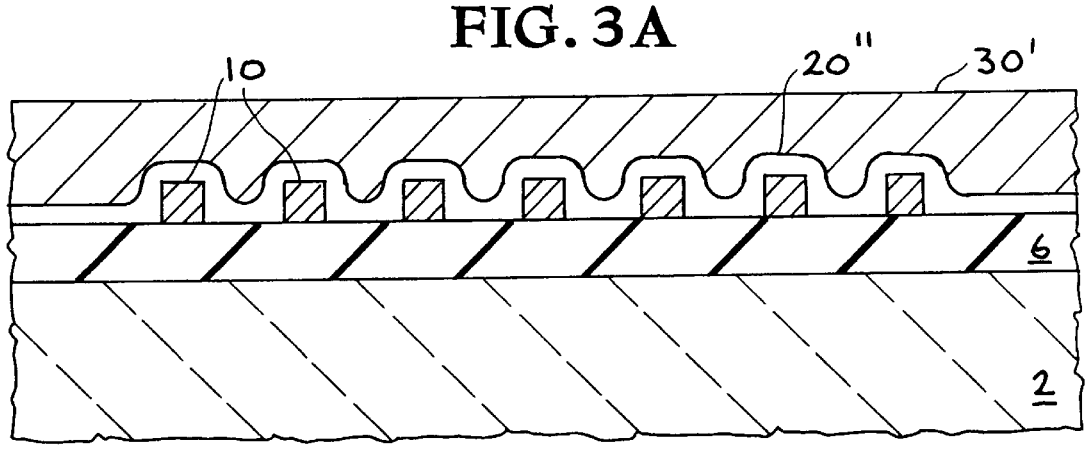
FIG. 4A is a fragmentary vertical cross-sectional view of the structure of FIG. 3A after the formation of the high magnetic susceptibility cobalt/nickel metal core over the conformal second insulation layer.

After formation of the structure of FIG. 3, a layer of high magnetic susceptibility cobalt/nickel metal is formed over second insulation layer 20, and then patterned to form high magnetic susceptibility cobalt/nickel metal core 30, as shown in FIGS. 4 and 5. The thickness of the cobalt/nickel metal core will range from at least about 0.1 micrometers ($\mu$m) up to as much as about 3 $\mu$m. Preferably, the cobalt/nickel metal core thickness will range from about 0.5 $\mu$m to about 2 $\mu$m, and most preferably from about 0.7 $\mu$m to about 1 $\mu$m. Alternatively, as shown in FIGS. 3A and 4A, a conformal layer of insulation 20'' may be formed over metal strips 10 (FIG. 3A), and the high magnetic susceptibility cobalt/nickel metal layer may then be deposited, planarized, and patterned to form core 30', as shown in FIG. 4A.

Figure 6:
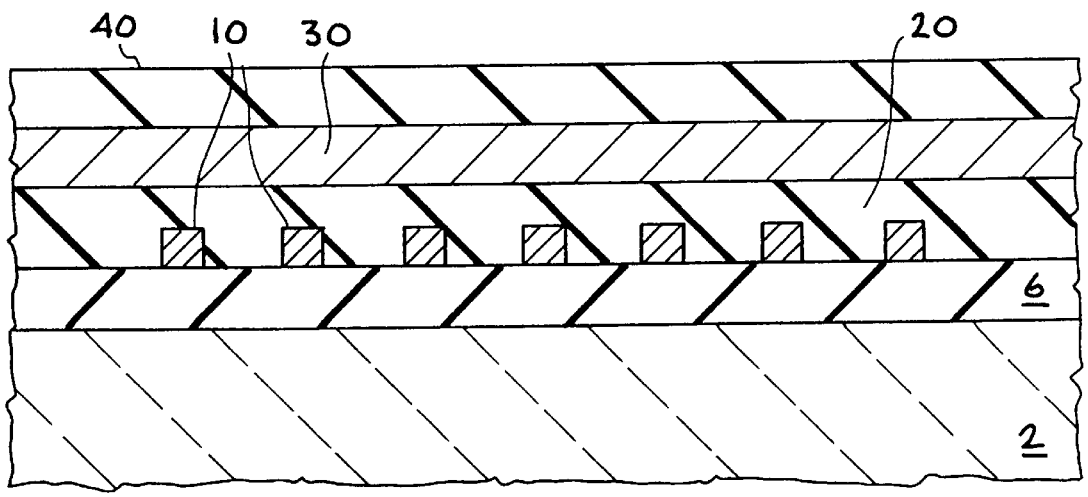
FIG. 6 is a fragmentary vertical cross-sectional view of the structure of FIGS. 4 and 5 after formation of a third insulation layer over the high magnetic susceptibility cobalt/nickel metal core.
Figure 7:
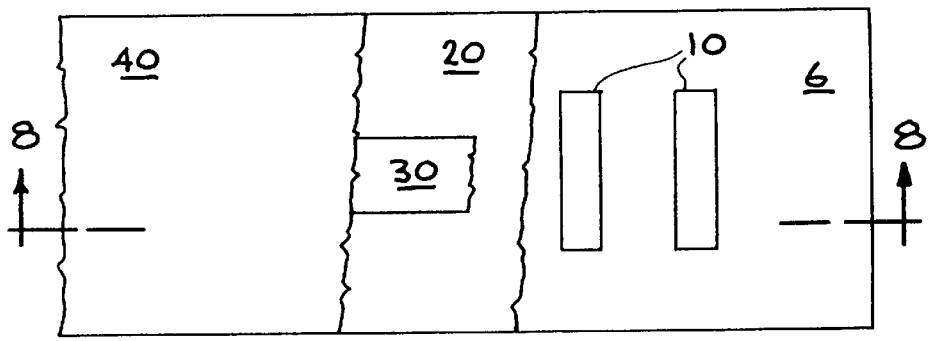
FIG. 7 is a partially cutaway fragmentary top view of the structure of FIG. 6.

After formation of high magnetic susceptibility cobalt/nickel metal core 30 (or 30'), a third insulation layer 40 is formed over core 30, as shown in FIGS. 6 and 7. Third insulation layer 40, like first insulation layer 6 and second insulation layer 20, may be formed of any insulation material such as, for example, silicon oxide or silicon nitride, compatible with the formation of integrated circuit structures. After planarization, the thickness of third insulation layer 40, over cobalt/nickel core 30, will range from at least about 100 Å to about 3000 Å, and preferably will range from about 500 Å to about 1000 Å. The upper surface of third insulation layer 40 will be planarized, as shown in FIG. 6, to permit formation thereon of the upper metal strips, as will be described below.

Figure 8:
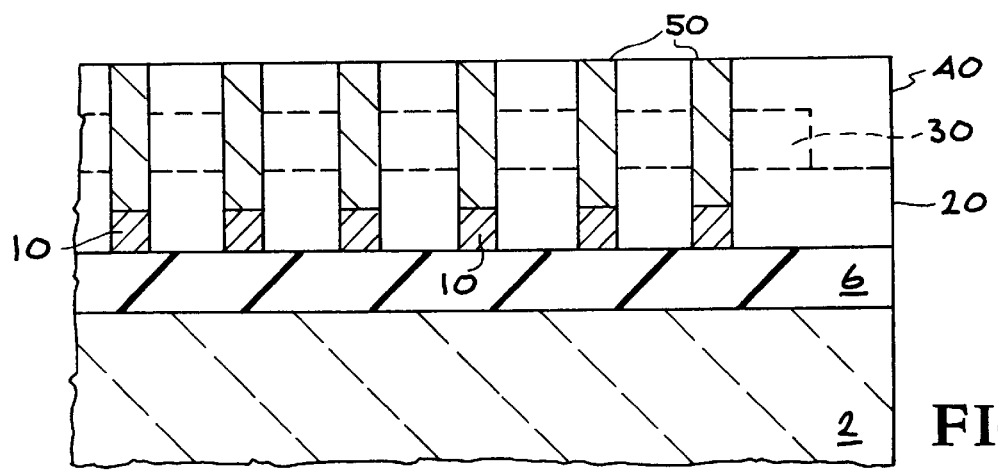
FIG. 8 is a fragmentary vertical cross-sectional view of the structure of FIG. 7 taken along lines 8—8 to show formation of filled vias from the lower metal coils through the second and third insulation layers and adjacent the high magnetic susceptibility cobalt/nickel core.
Figure 9:
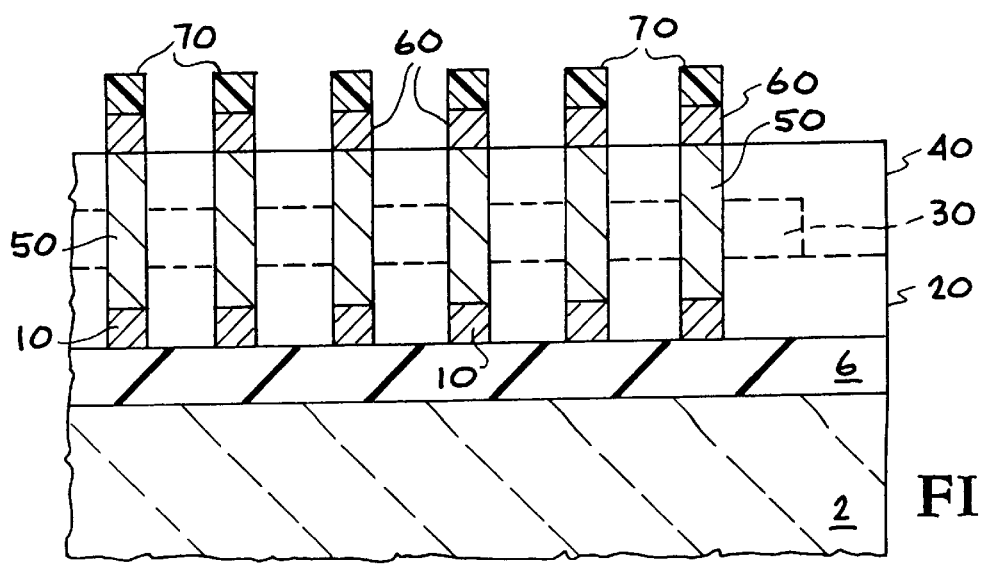
FIG. 9 is a fragmentary vertical cross-sectional view of the structure of FIG. 8 showing the formation of the upper metal coils over the filled metal vias.
Figure 10:
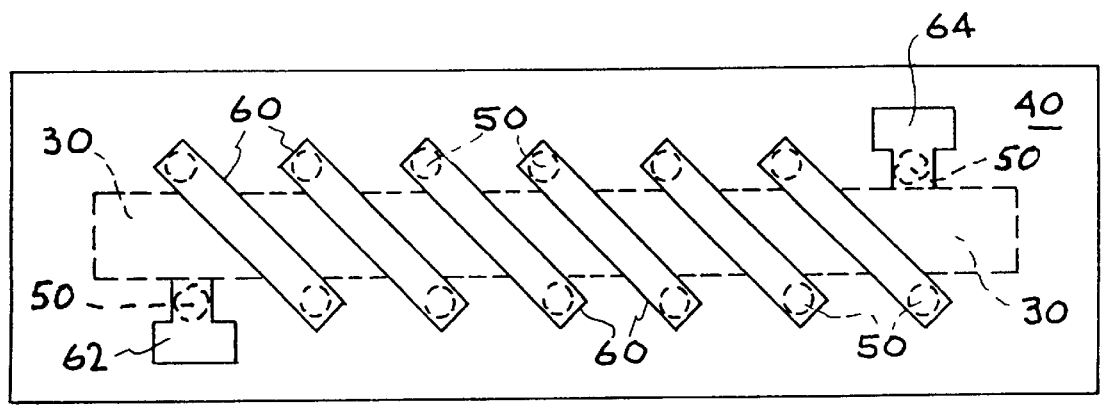
FIG. 10 is a top view of the structure of FIG. 9 after removal of the resist mask.

Vias 50 are then formed down through third insulation layer 40 and second insulation layer 20 to the opposite ends of metal strips 10, as shown in FIGS. 8–10, and filled with an electrically conductive metal, such as any of the metals used in forming metal strips 10, but preferably tungsten. As seen in FIGS. 9 and 10, an upper group of parallel, spaced apart metal strips 60 are then formed over third insulation layer 40 and in contact with filled vias 50. Upper metal strips 60 may be formed on third insulation layer 40 by blanket depositing any of the previously discussed metals used in forming lower metal strips 10 and then patterning the resulting metal layer to form metal strips 60, using a photoresist mask 70, as shown in FIG. 9. As best seen in FIG. 10, the upper metal strips 60 are disposed in parallel to one another on third insulation layer 40, but at an angle to lower metal strips 10, so that a filled via extending up from a first end of one lower metal strip contacts a first end of one of the upper metal strips, while the other end of the same upper metal strip contacts the second end of an adjacent lower metal strip (not the same lower metal strip) so that a continuous metal coil or spiral is formed between the lower metal strips, the filled vias, and the upper metal strips. Coil contact pads 62 and 64, as shown in FIG. 10, may then be formed on third insulation layer 40, with filled vias 50 connecting contact pads 62 and 64 with the corresponding lower metal strips which will comprise the ends of the metal coil.

The upper metal strips 60 may be formed by an alternative procedure similar to the procedure described with respect to FIG. 1A. A further layer of insulation could be deposited over third insulation layer 40 and a pattern of parallel trenches could be formed in the insulation layer down to the underlying filled vias, with the pattern of the trenches conforming to the desired pattern of metal strips. A layer of metal to be used in forming the metal strips would then be blanket deposited to fill the trenches, after which the portions of the metal layer not in the trenches would be removed, e.g., polished away by CMP, leaving only the desired metal strips.

Figure 11:
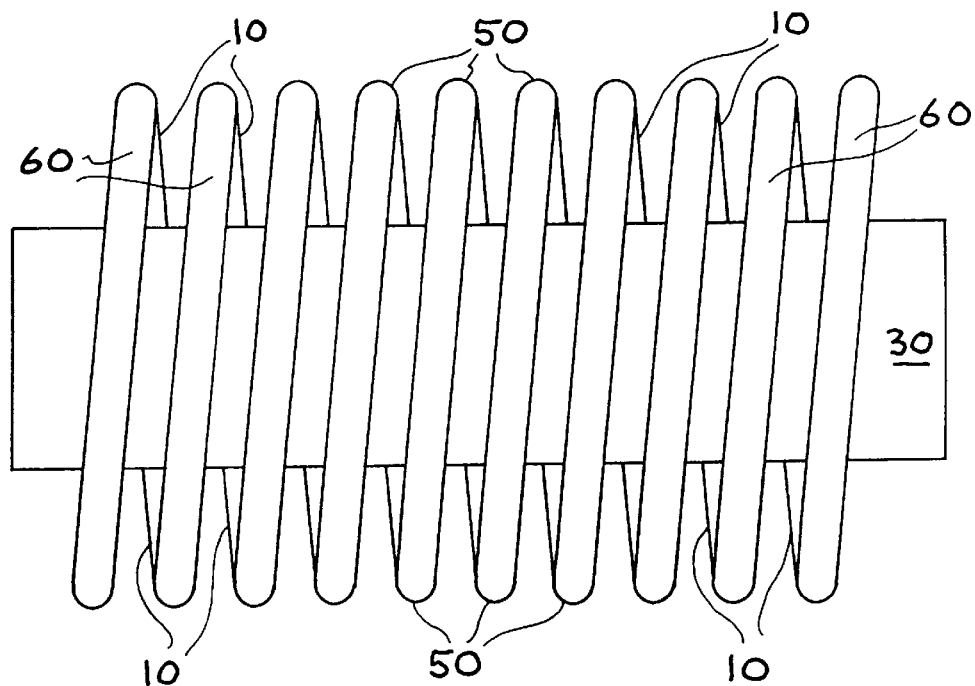
FIG. 11 is a top view of the inductor of the invention showing the lower and upper coils and the high magnetic susceptibility cobalt/nickel metal core therebetween, but eliminating the layers of insulation for illustrative purposes.

In any event, the resulting inductor structure, as illustrated in FIG. 11 (with the insulation layers removed for clarity), comprises a continuous metal coil which encircles the high magnetic susceptibility cobalt/nickel metal core, resulting in a high inductance, high Q-factor inductor formed as a part of an integrated circuit structure without the necessity of introducing foreign materials into the integrated circuit structure.

Figure 12:
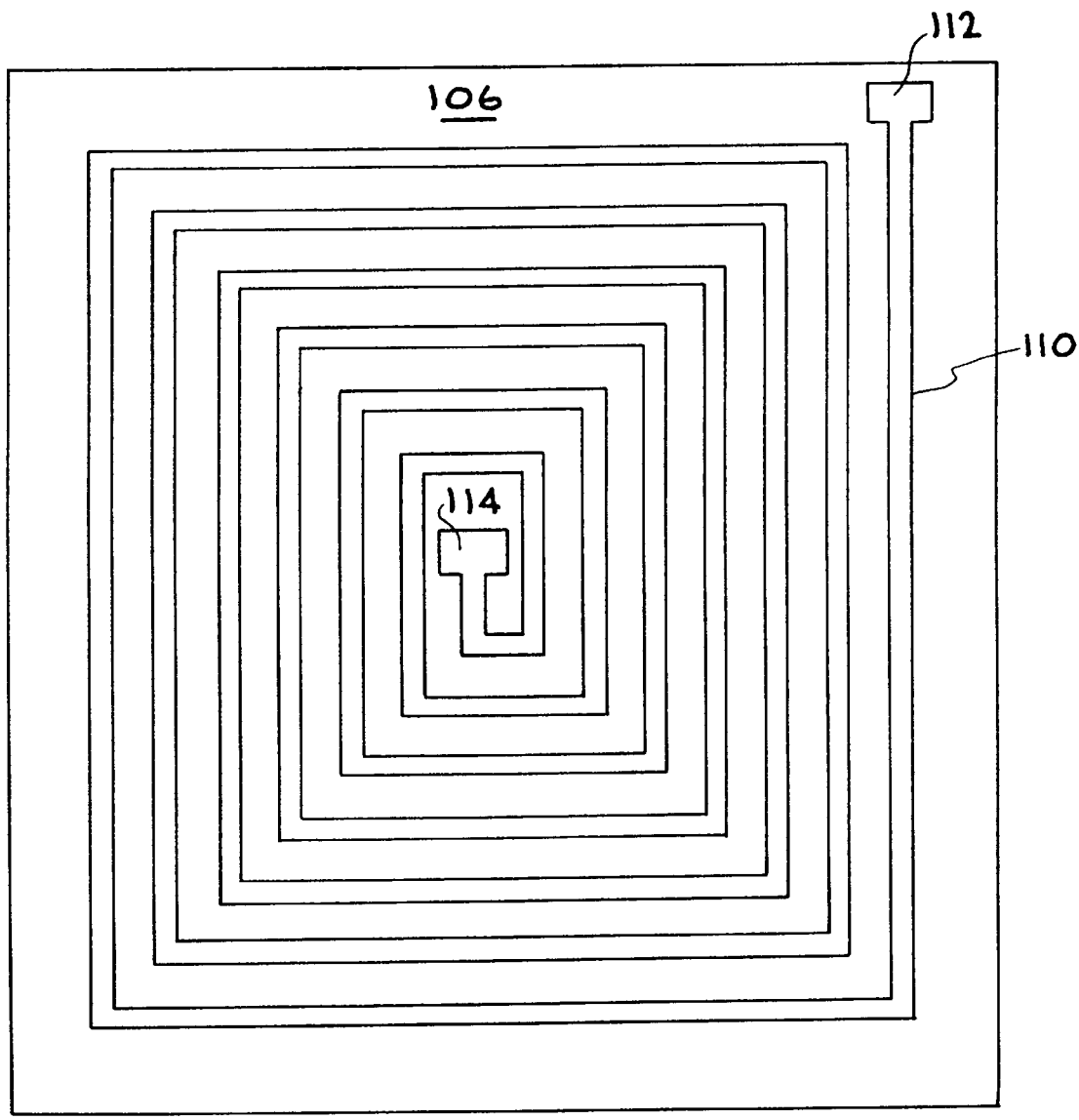
FIG. 12 is a top view of another embodiment of the invention showing a serpentine metal coil formed on a first insulation layer over a semiconductor substrate.

Turning now to FIGS. 12–19, construction of another embodiment of the high magnetic susceptibility cobalt/nickel metal core inductor of the invention is illustrated. In this embodiment, as shown in FIG. 12, a single continuous spiral metal coil or strip 110 is formed on a first insulation layer 106 formed over a semiconductor substrate 102 (shown in FIGS. 13–18). Metal coil 110 is formed with an outer end 112 and a central opposite end 114. Metal coil 110, like metal strips 10, may be formed of any metal used in integrated circuit structures such as, for example, aluminum, titanium, tungsten, or copper. Metal coil 110 may be formed by blanket deposition of a metal layer followed by masking and patterning of the metal coil. Alternatively, metal coil 110 may be formed using the previously described trench method, by first forming a spiral trench in an additional insulation layer formed over first insulation layer 106, then filling the trench with metal, and then removing any extra metal from the surface of the additional insulation layer by a CMP step.

As shown in FIG. 13, a conformal second layer of insulation 120, such as a silicon oxide or silicon nitride layer, is then formed over metal coil 110. The thickness of this conformal layer of insulation may range from about 100 Å to about 500 Å, but preferably with range from about 200 Å to about 300 Å. While second insulation layer 120 could be provided with a planarized upper surface, in this embodiment a conformal layer of insulation is preferred to permit location of the high magnetic susceptibility cobalt/nickel metal core between the turns of the serpentine coil 110, as will be discussed below.

Still referring to FIG. 13, over conformal second insulation layer 120 (and metal coil 110 thereunder) is formed a layer 130 of cobalt/nickel metal to form the high magnetic susceptibility cobalt/nickel metal core material for the inductor. Cobalt/nickel metal layer 130 is then masked with photoresist mask 134, as shown in FIG. 14, to remove portions of core layer 130 beyond the area delimited by the outer portions of metal coil 110, as well as to remove a central portion of core layer 130 overlying central portion or end 114 of metal coil 110, as shown in FIG. 15. The thickness of cobalt/nickel core layer 130 on the portion of conformal insulation layer 120 which is formed over the top surface of metal coil 110 should be at least about 0.1 micrometers ($\mu$m) up to as much as about 3 $\mu$m. Preferably, the cobalt/nickel metal core thickness will range from about 0.5 $\mu$m to about 2 $\mu$m, and most preferably from about 0.7 $\mu$m to about 1 $\mu$m.

It will be noted, from an examination of FIGS. 13–18, that the use of conformal insulation layer 120 over serpentine metal coil 110 permits the subsequent deposition of high magnetic susceptibility cobalt/nickel metal between the individual coils of metal coil 110. In view of the planar construction of metal coil 110, in comparison with the spiral metal coil formed in the previous embodiment of FIGS. 1–11, wherein the spiral metal coil encircles the high magnetic susceptibility cobalt/nickel metal core, it is believed that this positioning of a portion of the high magnetic susceptibility cobalt/nickel metal core material between the turns of serpentine metal coil 110 in this embodiment will enhance the performance of the resulting inductor.

Figure 16:
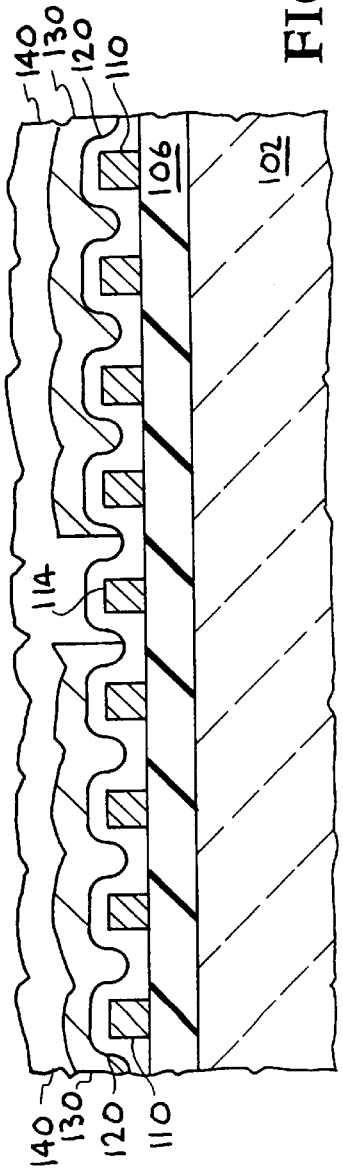
FIG. 16 is a fragmentary vertical cross-sectional view of the structure of FIG. 15 showing the formation of a conformal third layer of insulation over the cobalt/nickel layer.
Figure 17:
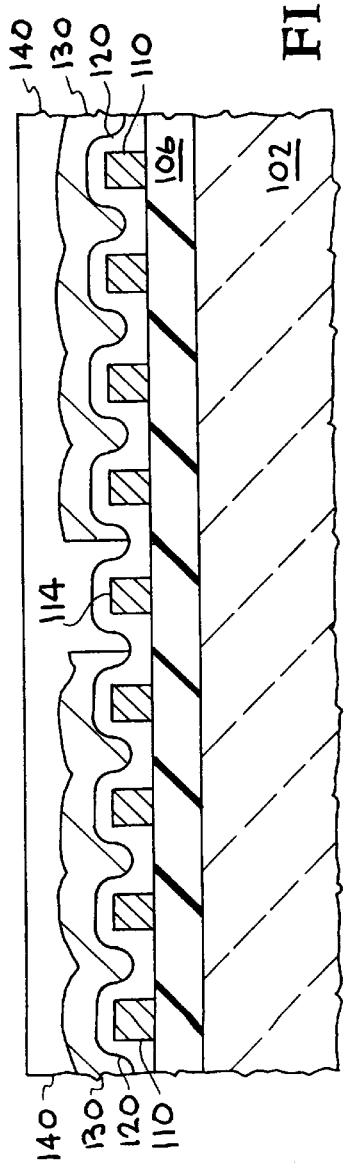
FIG. 17 is a fragmentary vertical cross-sectional view of the structure of FIG. 16 showing the planarization of the third layer of insulation.

Third insulation layer 140 is then formed over cobalt/nickel core layer 130, as shown in FIG. 16. The thickness of third insulation layer 140 over cobalt/nickel core 130, will range from at least about 100 Å to about 3000 Å, and preferably will range from about 500 Å to about 1000 Å. Third insulation layer 140 may then be planarized, as shown in FIG. 17, to facilitate forming a metal contact thereon to inner coil end 114.

Figure 18:
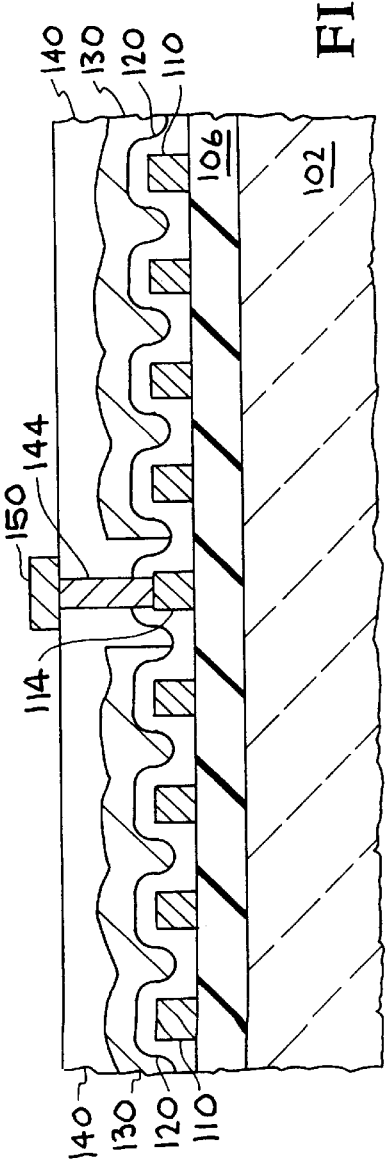
FIG. 18 is a fragmentary vertical cross-sectional view of the structure of FIG. 17 showing the formation of a metal contact on the surface of the third layer of insulation which electrically connects with the center contact of the serpentine coil of FIG. 12 through a filled via which extends from the metal contact down through the second and third insulation layers to the center contact on the coil.

As shown in FIG. 18, a via or opening is then cut through third insulation layer 140 and conformal second insulation layer 120 to the top surface of coil end 114 and then filled with a metal such as tungsten to form filled via 144. A further metal layer is then formed over the planarized top surface of third insulation layer 140 and patterned to form metal contact 150 over filled via 144. A similar metal contact (not shown) may be used with a second filled metal via (also not shown) through third insulation layer 140 and conformal second insulation layer 120 to provide an external electrical contact to outer end 112 of metal coil 110. Alternatively, outer coil end 112 may be designed to directly contact another portion of the integrated circuit structure which would make it unnecessary to provide an external contact to outer coil end 112.

Figure 19:
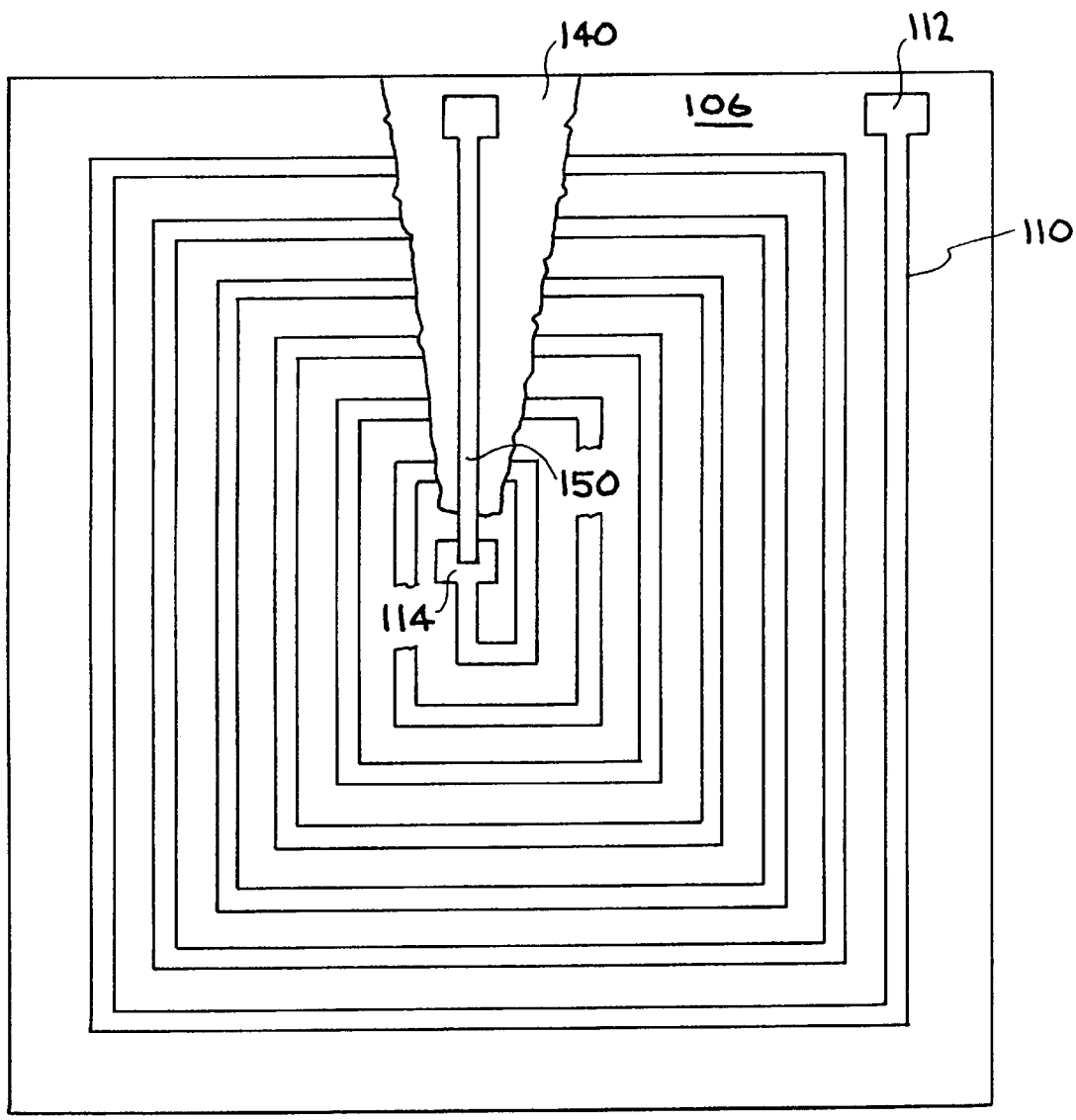
FIG. 19 is a top view of a portion of the structure of FIG. 18, showing the metal contact to the center contact of th e serpentine coil, but with the insulation layers and the high magnetic susceptibility cobalt metal core layer omitted for illustrative purposes only.

The top view of FIG. 19, in which the upper insulation layers (120 and 140) and high magnetic susceptibility cobalt/nickel metal core 130 have been removed for illustrative purposes only, shows that metal contact 150 may comprise an elongated strip (which extends perpendicular to the plane of FIG. 18) which would permit electrical contact being made to coil 110 through elongated contact 150 at the edge of the inductor rather directly above coil end 114 at the middle of the inductor.

Thus the invention provides integrated circuit structures with various forms of inductor structures comprising a continuous metal coil and a high magnetic susceptibility cobalt/nickel metal core, resulting in a high inductance, high Q-factor inductor formed as a part of an integrated circuit structure without the necessity of introducing foreign materials into the integrated circuit structure.

Having thus described the invention what is claimed is:

1. An integrated circuit structure comprising an inductor formed therein which includes a metal coil on one or more insulated surfaces over a semiconductor substrate, and a high magnetic susceptibility cobalt/nickel metal core located adjacent said metal coil, but spaced therefrom by one or more insulation layers.

2. The integrated circuit structure of claim 1 wherein said high magnetic susceptibility cobalt/nickel metal core is selected from the group consisting of cobalt metal, nickel metal, and an alloy of said two metals.

3. The integrated circuit structure of claim 1 wherein said high magnetic susceptibility cobalt/nickel metal core is located between lower and upper portions of said metal coil, and metal filled vias in said integrated circuit structure connect said lower and upper portions of said metal coil to form a continuous coil surrounding said high magnetic susceptibility cobalt/nickel metal core.

4. The integrated circuit structure of claim 1 wherein said metal coil is formed in a serpentine shape in one plane on the insulated surface over the semiconductor substrate, and the high magnetic susceptibility cobalt/nickel metal core is formed over and between turns of the serpentine coil, but spaced from said serpentine coil by another insulation layer.

5. An integrated circuit structure comprising an inductor formed therein which includes a metal coil on one or more insulated surfaced over a semiconductor substrate, and a high magnetic susceptibility cobalt metal core located within said metal coil, but spaced therefrom by one or more insulation layers.

6. An integrated circuit structure comprising an inductor formed therein which includes a metal coil on one or more insulated surfaces over a semiconductor substrate, and a high magnetic susceptibility nickel metal core located within said metal coil, but spaced therefrom by one or more insulation layers.

7. An integrated circuit structure comprising an inductor formed therein which includes a metal coil on one or more insulated surfaces over a semiconductor substrate, and a high magnetic susceptibility cobalt-nickel alloy metal core located within and between turns of said metal coil, but spaced therefrom by one or more conformal insulation layers.

8. An integrated circuit structure comprising an inductor formed therein which includes a metal coil in a serpentine shape in one plane on a first insulation layer over a semiconductor substrate, and a high magnetic susceptibility cobalt/nickel metal core is formed over and between turns of the serpentine metal coil, but spaced from said serpentine metal coil by a conformal second insulation layer.

* * * * *